(12) United States Patent
Lifka et al.

(10) Patent No.: US 8,022,614 B2
(45) Date of Patent: Sep. 20, 2011

(54) DISPLAY PANEL AND METHOD FOR MANUFACTURING THE SAME

(75) Inventors: Herbert Lifka, Eindhoven (NL); Marc Wilhelmus Gijsbert Ponjee, Eindhoven (NL); Nigel David Young, Meadvale (GB); Nijs Cornelis Van Der Vaart, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 459 days.

(21) Appl. No.: 11/721,705

(22) PCT Filed: Dec. 12, 2005

(86) PCT No.: PCT/IB2005/054173
§ 371 (c)(1),
(2), (4) Date: Jul. 15, 2009

(87) PCT Pub. No.: WO2006/064443
PCT Pub. Date: Jun. 22, 2006

(65) Prior Publication Data
US 2009/0295273 A1 Dec. 3, 2009

(30) Foreign Application Priority Data
Dec. 16, 2004 (EP) .................................. 04106622

(51) Int. Cl.
*H01L 51/50* (2006.01)

(52) U.S. Cl. .......................... 313/504; 313/512; 428/690
(58) Field of Classification Search .................. 313/504, 313/512; 428/690; 445/25
See application file for complete search history.

(56) References Cited

U.S. PATENT DOCUMENTS

| | | | |
|---|---|---|---|
| 2001/0055454 A1 | 12/2001 | Roach et al. | |
| 2003/0062826 A1* | 4/2003 | Seo et al. | 313/504 |
| 2004/0012329 A1* | 1/2004 | Kobayashi | 313/504 |
| 2004/0135497 A1* | 7/2004 | Kim et al. | 313/504 |
| 2005/0046341 A1* | 3/2005 | Ikeda et al. | 313/504 |

FOREIGN PATENT DOCUMENTS

| | | |
|---|---|---|
| EP | 0892028 A2 | 1/1999 |
| EP | 0892028 B1 | 1/1999 |
| WO | 2005051049 A1 | 6/2005 |

* cited by examiner

*Primary Examiner* — Nimeshkumar D. Patel
*Assistant Examiner* — Mary Ellen Bowman

(57) ABSTRACT

A display panel includes pixels with a light emissive layer and an electrode layer deposited on the light emissive layer. A first pixel is determined by a first barrier structure and a second pixel, adjacent to the first pixel, is determined by a second barrier structure. The first and second barrier structures are separated by an electrically conductive structure in electrical contact with the electrode layer. Accordingly, space is available between the barrier structures for electrical shunting of the electrode layer.

15 Claims, 4 Drawing Sheets

DISPLAY PANEL AND METHOD FOR MANUFACTURING THE SAME

The invention relates to a display panel comprising a plurality of display pixels with at least one light emissive layer and at least one electrode layer deposited on or over said light emissive layer. The invention further relates to a method for manufacturing a display panel.

Display panels employing display pixels comprising light emitting elements provided on a substrate are becoming increasingly popular. These light emitting elements may be light emitting diodes (LEDs), incorporated in or forming the display pixels that are arranged in a matrix of rows and columns. The light emissive or electroluminescent materials employed in such LEDs are suitable to generate light when a current is conveyed through these materials, such as particular polymeric (PLED) or small molecule organic (SMOLED) materials. PLED and SMOLED display panels have opened a new path to make high quality displays. The advantages of these display panels are the self-emissive technology, the high brightness, the large viewing angle and the fast response time. The LEDs are arranged such that a flow of current can be driven through these electroluminescent materials. Typically, passively and actively driven matrix displays are distinguished. For active matrix displays, the display pixels themselves comprise active circuitry such as one or more transistors.

PLED materials provide advantages over SMOLED materials due to their intrinsic characteristics of thermal stability, flexibility and solubility in aqueous solutions or solvents. As a result, PLED materials can be applied by wet chemical techniques such as spin-coating or ink jet deposition.

EP-A-0 892 028 discloses an organic EL element wherein transparent pixel electrodes are formed on a transparent substrate. Photolithographically defined photoresist banks are formed between the pixel electrodes to prevent a liquid ink drop comprising electroluminescent material to flow to adjacent display pixels.

For some display panels, e.g. top emission display panels or translucent display panels, the top electrode layer for conveying current for the electroluminescent materials should be transparent for the light emitted from the light emissive layers. Such transparent electrode layers may intrinsically have a relatively high electrical resistance, such as indium tin oxide (ITO), indium zinc oxide (IZO) or aluminum zinc oxide (AZO). Alternatively, or in addition very thin metallic layers may be used, but these typically have a large electrical sheet resistance. Accordingly, for such display panels a conflict exists in either increasing the thickness of the electrode layer to decrease the electrical resistance at the cost of material stability of the electrode layer or decreasing the thickness of the top electrode layer to enhance the transparency yielding an even higher electrical resistance having detrimental effects on the power consumption of devices employing such display panels.

It is an object of the present invention to provide a display panel with an optically transparent electrode layer of low resistance.

This object is accomplished by a display panel wherein at least a first display pixel is determined by a first barrier structure and a second display pixel, adjacent to said first display pixel, is determined by a second barrier structure and wherein said first barrier structure and said second barrier structure are separated by an electrically conductive structure in electrical contact with said electrode layer.

In such a display panel, the electrical resistance of the electrode layer is decreased by the shunting effect of the electrically conductive structure without affecting the thickness of the electrode layer. Therefore, the thickness of the electrode layer can be maintained reasonably thin without resulting in an unacceptable increase of the electrical resistance of the electrode layer. As the first and second barrier structure are provided at a certain distance from each other, an area is available to accommodate such an electrically conductive structure.

In another embodiment, a further electrode layer formed under said light emissive layer and comprising the same electrically conductive material as the layer of the electrically conductive structure. This provides the advantage that the electrically conductive layer of the electrically conductive structure and the further electrode layer of the display pixels can be deposited simultaneously using the same material. Preferably, this material is a material with a low electrical contact resistance to the electrode layer of the display pixel, such as indium tin oxide (ITO). ITO further has the advantage that it is transparent for light emitted from the light emissive layer, such that the display panel may be a bottom-emission type of display.

In another embodiment, an insulating layer and a further electrically conductive layer are formed under the electrically conductive structure, where the conductive structure and the further electrically conductive layer are electrically connected via through-holes in the insulating layer. This has the advantage that a more effective shunting of the electrode layer can be obtained. As the further electrically conductive layer is not in direct electrical contact with the electrode layer, contact resistance considerations with respect to the electrode layer are less relevant. The further electrically conductive layer or layer structure can be fully tailored to low electrical resistance.

In another embodiment, the display pixels are determined by barrier structures with round corners arranged in rows and columns, and the through-holes are located in an area between the round corners of the barrier structures. This has the advantage that the through-holes in the insulating layer are provided in areas where sufficient space is available.

In another embodiment, the electrically conductive structure comprises a metallic layer. This has the advantage that the metallic layer or layer structure has a low electrical resistance providing for effective shunting operation.

In another embodiment, first and second display pixels comprise a further metallic layer, formed under the light emissive layer, comprising the same metal as said metallic layer. This has the advantage that the further metallic layer of the display pixels, used as a reflective layer for top-emission type of displays to reflect light of the light emissive layer away from the substrate, can be deposited simultaneously with the metallic layer of the electrically conductive structure using the same material.

In another embodiment, the electrically conductive structure comprises an electrically conductive layer under the metallic layer, where the first and said second display pixels comprise a further electrode layer, formed under the light emissive layer, comprising the same electrically conductive material as the electrically conductive layer. This has the advantage that freedom for defining structures below the display pixels is enhanced. The metal layer can be chosen from a material of very low electrical resistance, such that further metallic layers can be used for other connections.

In another embodiment, a hydrophilic layer is formed at the first and second barrier structures contacting the light emissive layer. This has the advantage that by providing a hydrophilic material at or near the sidewalls of the barrier structures, a better wetting performance for the display pixel is obtained with respect to the PLED material.

In another embodiment, the display panel comprises contact lines to provide a signal for the electrode layer via the electrically conductive structure. This allows the manufacture of smaller display panels as external cathode contacts may be omitted.

In another embodiment, the display panel comprises at least a low electrical resistance line for the first and/or second display pixel, where the low electrical resistance line is defined on or over the electrically conductive structure. This allows the display panel to be fully transparent for light emitted from the light emissive layer.

The invention also relates to a display panel formed on a substrate and comprising a plurality of display pixels with at least one light emissive layer and at least one electrode layer deposited on or over said light emissive layer, wherein at least a first display pixel is determined by a first organic barrier structure and a second display pixel, adjacent to said first display pixel, is determined by a second organic barrier structure and wherein said first barrier structure and said second barrier structure are separated by an electrically conductive structure.

As the organic barrier structures inherently allow substantial diffusion of water from the light emissive layer, the electrically conductive structure formed between the barrier structures effectively prevents diffusion of water while allowing the use of organic barrier structures. The use of organic barrier structures is advantageous since such barrier structures fit in the standard manufacturing process and can be easily tailored with respect to the wetting characteristics.

In another embodiment, a thin film encapsulation layer is provided over the electrode layer. This provides the advantage that, for an electrode layer allowing diffusion of water, this diffusion path is blocked by the thin film encapsulation layer.

Moreover, the invention relates to an electric device comprising a display panel according to one or more of the embodiments described above and a signal controller communicatively connected to said display panel.

The invention also relates to a method for manufacturing a display panel comprising the steps of:

applying a first barrier structure on a substrate to determine a first display pixel with an emissive layer and an electrode layer;

applying a second barrier structure on a substrate to determine a second display pixel, adjacent to said first display pixel, with an emissive layer and an electrode layer;

providing an electrically conductive structure separating said first barrier structure and said second barrier structure in electrical contact with said electrode layer.

This manufacturing method results in a display panel, the electrode layer whereof is shunted to allow a thin electrode layer of reasonably low electrical resistance.

In another embodiment, the method further comprise simultaneously forming the further electrode layer for the first and second display pixel and the electrically conductive layer for the electrically conductive structure. Further, the method includes forming an insulating layer under the electrically conductive structure; forming a further electrically conductive layer; and electrically connecting the further electrically conductive layer to the electrically conductive structure via through-holes in the insulating layer. These provide for an effective electrical shunting of the electrode layer.

It is noted that the non-prepublished European patent application with application number EP 03104322 describes a display panel with electrically conductive structures shunting the cathode layer. The electrically conductive structures simultaneously perform the function of a barrier structure. However, adjacent display pixels in this application share a single barrier structure in contrast to the present invention. Moreover, the barrier structures of EP 03104322 are manufactured of electrically conductive material.

The invention will be further illustrated with reference to the attached drawings, which schematically show preferred embodiments according to the invention. It will be understood that the invention is not in any way restricted to these specific and preferred embodiments.

Figure 3:
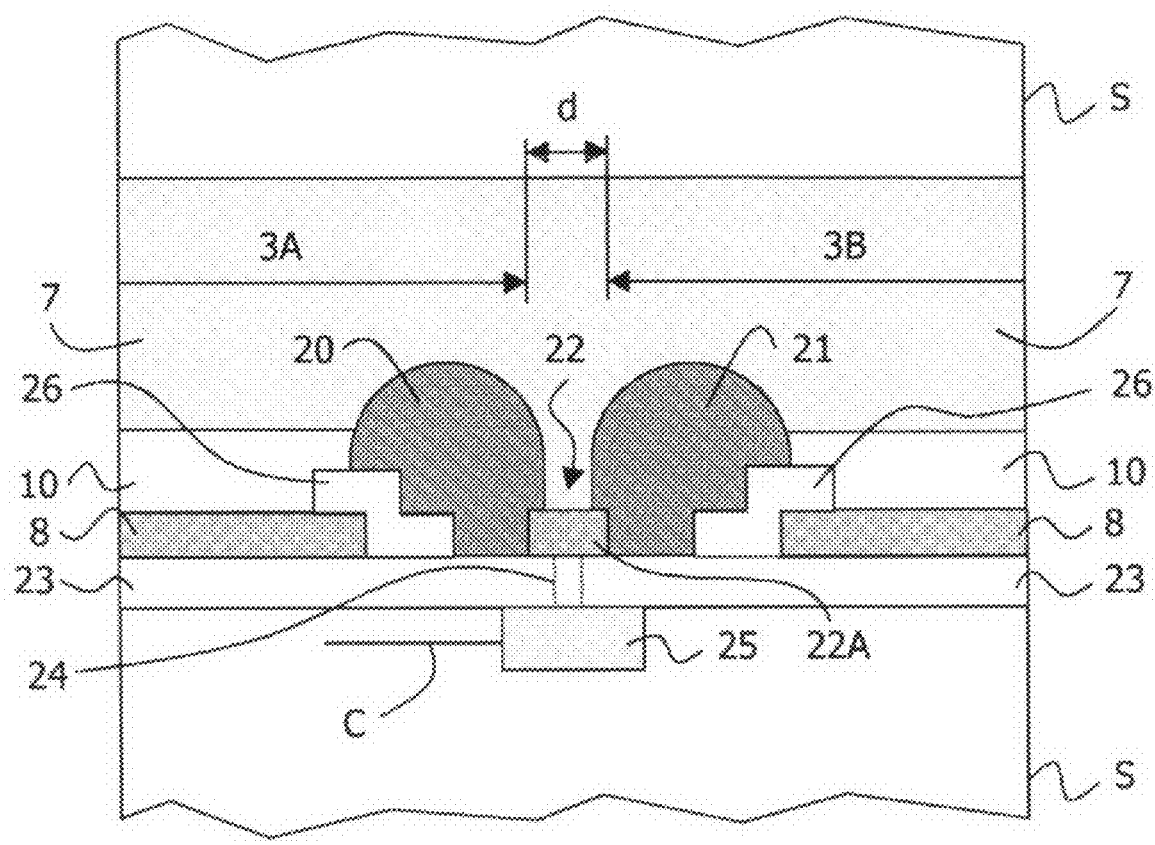
Figure 4A:
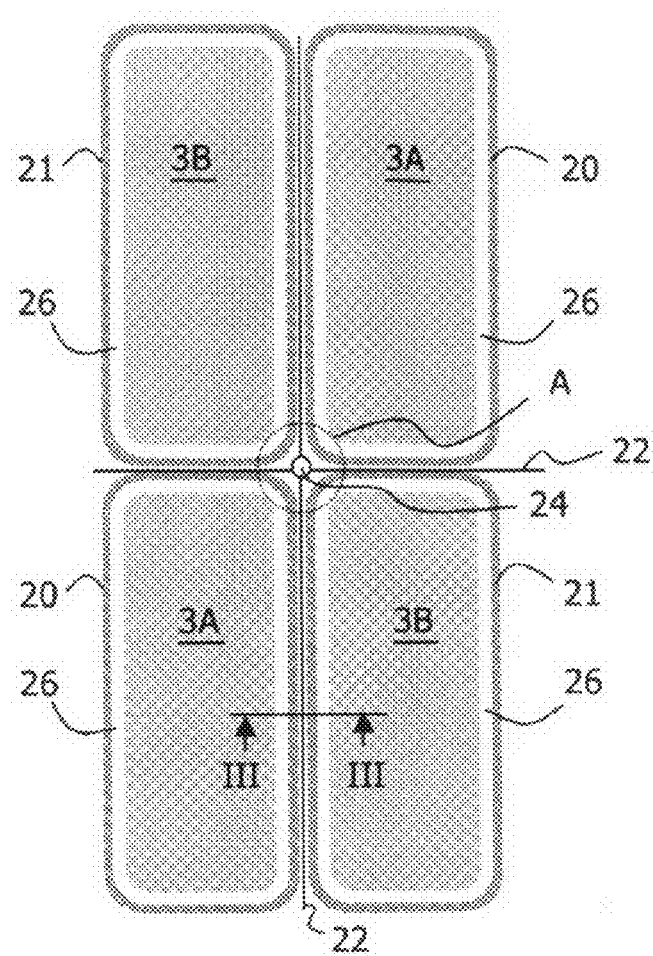
Figure 4B:
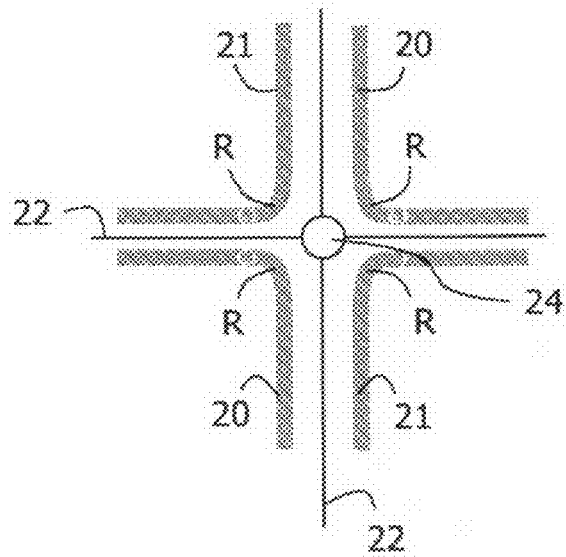

FIG. 3 schematically shows a cross-section of a first and second display pixel of a display panel portion according to a first embodiment of the invention;

FIGS. 4A and 4B show schematic top views of the display panel according to the first embodiment of FIG. 3, and FIGS. 5-7 schematically show cross-sections of a first and second display pixel for a display panel portion according to respectively a second, third and fourth embodiment of the invention.

Figure 1:
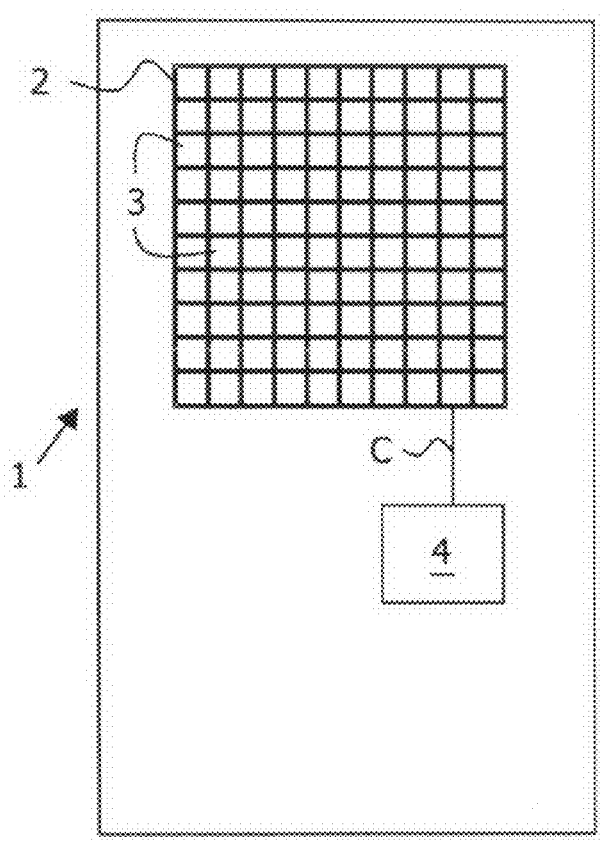
FIG. 1 is a schematic illustration of an electric device comprising a display panel according to an embodiment of the invention.

FIG. 1 is a schematic illustration of an electric device 1 comprising a display panel 2 with display pixels 3 and a signal processor 4 for driving the display pixels 3 via contact lines C.

Figure 2:
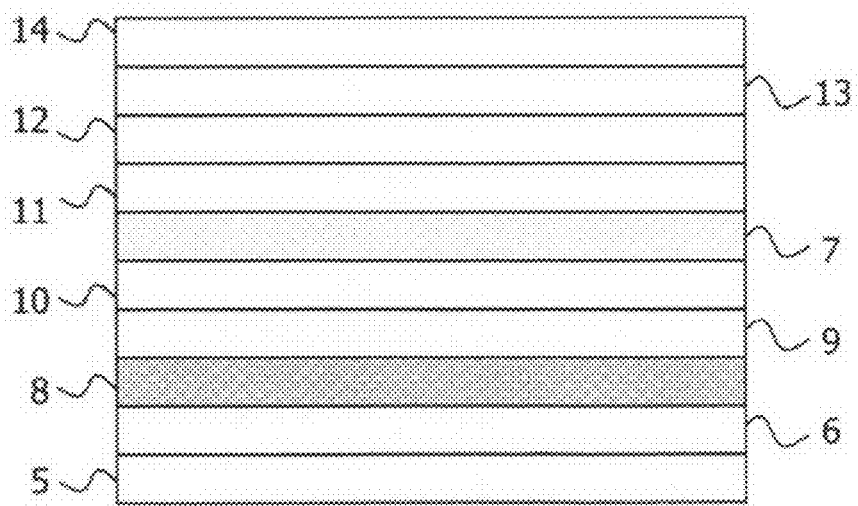
FIG. 2 shows in cross-section a conventional layer stack of a display pixel for a PLED top emission display panel.

FIG. 2 shows a typical layer stack for a display pixel 3. It should be appreciated that the term "layer" may comprise a layer stack of two or more layers of a material enabling the layer stack to perform the function of a single layer shown in FIG. 2. Further, it should be noted that the layer stack of FIG. 2 may comprise further layers, such as one or more insulation layers.

The display pixel 3 is formed on a substrate 5. The substrate 5 may e.g. be made of glass or silicon. For bottom-emission types of display panels, the substrate 5 should be transparent for the light of the display pixel 3. Of course, for a transparent display panel this consideration holds as well.

For a top-emission display panel 2, a reflective layer 6 is provided over the substrate 5. The reflective layer 6 may be a metal layer or layer stack, e.g. comprising an Cr/Al/Cr or a Mb/Al/Mb stack. It is noted that between the substrate 5 and the reflective layer 6, active devices, such as transistors, are typically defined by a series of layers (not shown).

The core of the display pixel 3 is formed by an electrode layer 7 and a further electrode layer 8, conventionally referred to as a cathode layer respectively an anode layer, sandwiching a stack of a first polymer layer 9, such as a polyethylenedioxythiophene (PEDOT) layer and a light emitting polymer layer 10, such as polyphenylenevinylene (PPV). By engineering red, green and blue emitting layers, a full color display panel can be accomplished. At least one of the cathode layer 7 or the anode layer 8 are transparent for the light emitted from the light emitting polymer layer 10. As an example, such a transparent layer 7, 8 may be made of indium tin oxide (ITO).

For top emission display panels, i.e. display panels 2 wherein the light emission is directed away from the substrate 5, the cathode layer 7 should be transparent. The cathode layer may e.g. be made of ITO, indium zinc oxide (IZO) or aluminum zinc oxide (AZO). Alternatively or in addition thin metallic layers (typically several tens of nanometers), preferably having a low work function, may be applied. Typical compositions include a low work function metal like Ba, Mg, LiF or Ca with a thin metal e.g. Ag or Al.

Further layers may be provided over this core such as multifunctional layers 11, e.g. for enhancing light output, a thin film encapsulation layer 12, a polymer encapsulation layer 13 and a circular polarizer 14 to enhance the contrast of the display panel 2.

It is noted that some of the layers in the layer stack of FIG. 2 may be shared by a plurality of display pixels 3, such as the substrate 5, the transparent cathode 7 for an active matrix top-emission display panel 2 and the circular polarizer 14.

FIGS. 3, 4A and 4B schematically show a cross-section III-III, a top overview of a portion of the display panel 2 and a detailed top-view of a first display pixel 3A and an adjacent second display pixel 3B for a display panel 2 according to a first embodiment of the invention. FIG. 3 shows upper and lower structures S, e.g. comprising respectively the substrate 5 and the polymer encapsulation layer 13 of FIG. 2, that will not be discussed in further detail here. For reasons of simplicity, the polymer layers 9, 10 are represented as a single layer 10. In FIGS. 4A and 4B the cathode layer 7 and the light emitting layer 10 are not displayed for reasons of clarity. Layers or layer stacks described with reference to FIG. 2 bear identical reference numbers.

The first display pixel 3A is determined by a first barrier structure 20 and the second display pixel 3B, adjacent to the first display pixel 3A, is determined by a second barrier structure 21. The first and second barrier structures 21, 22 may be of an organic material, such as a photoresist like JSR1400G. The barrier structures 21, 22 have a width in the range of 1-10 μm, e.g. 5 μm, and a height between 0.5 μm and 5 μm, e.g. 2 μm The first barrier structure 20 and second barrier structure 21 are separated over a distance d such that electrically conductive material, e.g. in the form of an electrically conductive structure 22 with an electrically conductive layer 22A, can be positioned between these barrier structures 20, 21 and contact the cathode layer 7. The alignment of the barrier structures 20, 21 is not critical with respect to the electrically conductive structure.

Considerations in determining the distance d should balance the undesirable loss of resolution for the display panel 2 if the distance d is too large and the undesirably high electrical contact resistance between the cathode layer 7 and the electrically conductive structure 22 if the contact area is too small. The distance d between the barrier structures 20, 21 can be as small as e.g. 0.5 μm. In general, the distance d is in the range of 1-10 μm, such as 5 μm. The electrical contact resistance may, apart from having a large surface area, be decreased by choosing a suitable material for the electrically conductive structure 22. As an example, an electrically conductive layer 22A of ITO provides a low electrical contact resistance between the cathode layer 7. However, alternatively or additionally one or more metallic layers may be used for the structure 22.

As shown in FIG. 3, the electrically conductive structure 22 is provided at the same level and of the same material, e.g. ITO, as the further electrode layer 8, i.e. the anode layer, underneath the light emitting layers 10. It should however be appreciated that the electrically conductive layer 22A and the anode layer 8 may be of different material.

The anode layer 8 and the electrically conductive structure 22 are provided on or over an insulating layer 23, such as silicon dioxide or silicon nitride.

Since the electrically conductive structure 22, e.g. if the electrically conductive layer 22 is made of ITO, may still have a substantial electrical sheet resistance, a through-hole 24 may be provided in the insulating layer 23 to contact a further electrically conductive layer or layer stack 25. The layer or layer stack 25 comprises metallic layers, such as a Cr/Al/Cr or a Mo/Al/Mo stack. Accordingly, the cathode layer 7 is electrically connected to the further electrically conductive layer 25. It should be noted that the through-hole 24 and further electrically conductive layer 25 may be omitted for an electrically conductive structure 22 with an adequate electrical contact resistance with respect to the cathode layer 7 and a reasonably high electrical conductance for carrying current of the cathode layer 7. Further, it should be appreciated that the through-holes 24 may penetrate more layers than the insulating layer 23, dependent on the level of the further electrically conductive layer 25.

It is noted that the electrically conductive structure may be formed by a protrusion of the cathode layer 7 itself, i.e. the cathode layer 7 extends between the barrier structures 20, 21 through the hole 24 to contact the further electrically conductive layer or layer stack 25. However, cleaning of the interface between the cathode layer 7 and the layer or stack 25 to obtain a low contact resistance is difficult.

As specifically shown in FIG. 4B, the through-holes 24 are located in an area A between round corners R of the barrier structures 20, 21, as these areas A provide sufficient space for such through holes 24. Consequently, the cathode layer 7 has an electrical connection with the further electrically conductive layer 25 via the electrically conductive structure 22 such that the cathode layer 7 is shunted, i.e. the electrical resistance of the combination of the cathode layer 7 and the further electrically conductive layer 25 is significantly smaller than for the cathode layer 7 as such. The electrical resistance of the combination typically may be only 10% or less of the electrical resistance of the cathode layer 7 as such.

Apart from the shunting effect on the cathode layer 7, the presence of the electrically conductive structure 22 also forms an effective diffusion barrier for water present in the polymeric material(s) forming the light emissive layer 10. This allows the barrier structures 20, 21 to be manufactured of organic materials, as such being permeable for water, which is advantageous since such barrier structures are already part of the conventional display panel manufacturing process. This diffusion barrier effect of the electrically conductive material present between the barrier structures 20, 21 is independent of the presence of through-holes 24 and the further electrically conductive layer 25. Moreover, for a sufficiently high electrically conductive structure 22, this structure 22 does not necessarily contact the cathode layer 7. The cathode layer 7 itself has been observed to allow diffusion of water in certain occasions. The provision of a thin film encapsulation layer 12 (FIG. 2) over the cathode layer 7 may block water diffusion from one display pixel to another via the cathode layer 7.

Still a further advantage of the invention includes the possibility to omit external contacts for connecting to the cathode as the electrically conductive structure 22 or the further electrically conductive layer 25 enables direct electrical contact over the signal line C with the signal processor 4. Accordingly, the invention provides advantages for bottom-emission types of display panels as well.

Finally, as shown in FIGS. 3, 4A and 4B, before providing the light emissive layer 10, a layer 26 of hydrophilic material may be applied inside the display pixels 3A,3B. The hydrophilic material, such as silicon dioxide, improves the wetting performance of the display pixels 3A, 3B without reducing the shunt area A.

Figure 5:
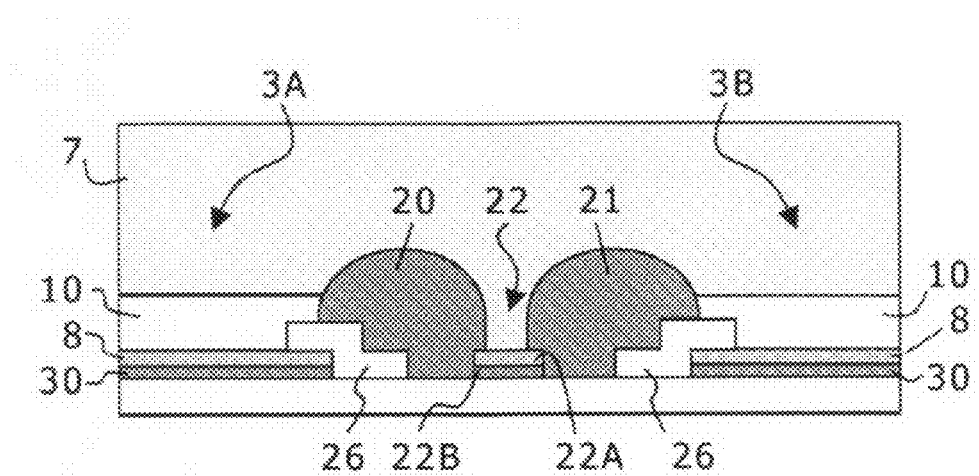
Figure 6:
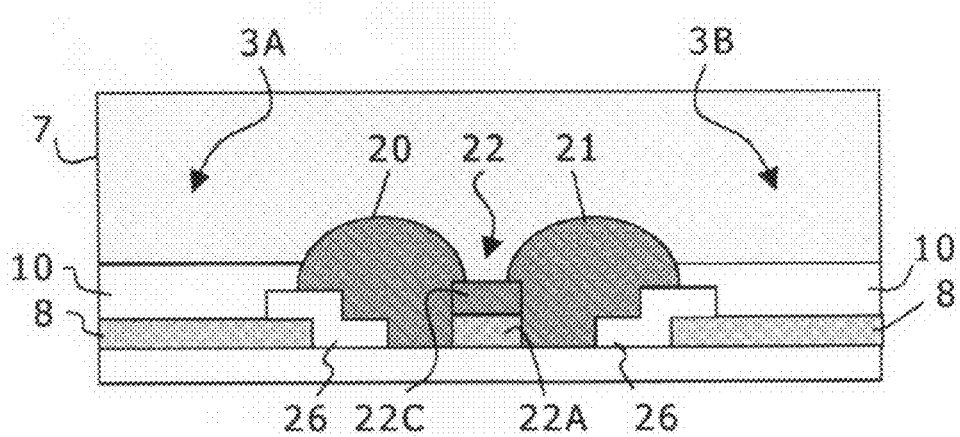
Figure 7:
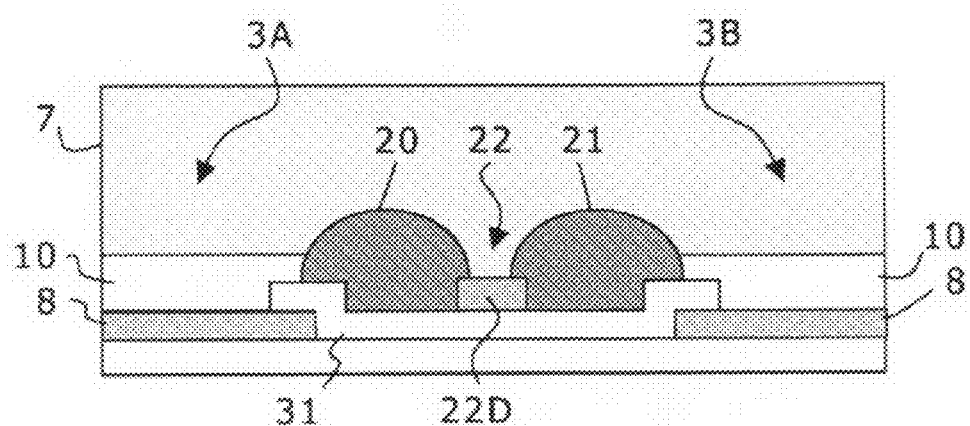

FIGS. 5-7 schematically show cross-sections of a first and second display pixel 3A, 3B for a display panel portion according to respectively a second, third and fourth embodiment of the invention. Identical reference numbers indicate identical or similar layers as in FIGS. 2 and 3. The further layer stacks S of FIG. 3 have been omitted for reasons of clarity.

In FIG. 5 an additional reflective layer 30 is provided under the anode layer 8, preferably made of ITO. Such a reflective layer 30, typically comprising a metallic layer or layer stack, is used for top-emission type of display panels 2 to reflect light from the light emissive layer 10 away from the substrate 5. The same material is also provided as metallic layer 22B under the electrically conductive layer 22A to form the electrically conductive structure 22. Accordingly, this metallic layer 22B may replace the further electrically conductive layer 25 of FIG. 3 and the through-holes 24 may be omitted as well.

FIG. 6 schematically shows an alternative embodiment, wherein the electrically conductive structure 22 comprises a metallic layer 22C provided over the ITO electrically conductive layer 22A. Although this embodiment requires an additional manufacturing step, it leaves more freedom for structures below the display pixels 3A, 3B. The metallic layer 22C and the ITO electrically conductive layer 22A can be structured simultaneously. The layer structure of FIG. 6 allows to define conductor line for the display pixels 3A, 3B on top of the electrically conductive layer 22A.

FIG. 7 schematically displays another embodiment of the invention, wherein the electrically conductive structure 22 comprises a metallic layer or layer stack 22D provided on or over a silicon dioxide layer 31. The silicon dioxide layer is combined with the hydrophilic layer 26 described with reference to FIG. 3.

It should be appreciated that for the embodiments depicted in FIGS. 5-7, the electrically conductive structure 22 enables direct contact to the cathode layer 7 over the line C. Further, the electrically conductive structure 22 contacting the cathode layer 7 provides an effective diffusion barrier for water present in the polymer materials of the display pixels 3A, 3B.

It should be noted that the above-mentioned embodiments illustrate, rather than limit, the invention, and that those skilled in the art will be able to design many alternative embodiments without departing from the scope of the appended claims. The gist of the invention relates to providing separate barrier structures for each display pixel such that space is available, at the cost of resolution, between these barrier structures for electrically shunting the cathode layer.

In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The mere fact that certain measures are recited in mutually different dependent claims does not indicate that a combination of these measures cannot be used to advantage.

The invention claimed is:

1. A display panel comprising a plurality of display pixels with a light emissive layer and an electrode layer deposited on or over said light emissive layer, wherein a first display pixel is determined by a first barrier structure and a second display pixel, adjacent to said first display pixel, is determined by a second barrier structure, wherein said first barrier structure and said second barrier structure are separated by an electrically conductive structure in electrical contact with said electrode layer, and wherein said display panel further comprises an insulating layer formed under said electrically conductive structure and a further electrically conductive layer comprising a metal, and wherein said electrically conductive structure and said metal are electrically connected via through-holes in said insulating layer.

2. The display panel according to claim 1, wherein said electrically conductive structure comprises an electrically conductive layer, and wherein said first display pixel and said second display pixel comprise a further electrode layer formed under said light emissive layer and comprising a same electrically conductive material as said electrically conductive layer.

3. The display panel according to claim 2, wherein said further electrode layer and said electrically conductive layer comprise indium tin oxide.

4. The display panel according to claim 1, wherein said display pixels are determined by barrier structures with round corners arranged in rows and columns and said through-holes are located in an area between said round corners of said barrier structures.

5. The display panel according to claim 1, wherein said electrically conductive structure comprises a metallic layer.

6. The display panel according to claim 5, wherein said first display pixel and said second display pixel comprise a further metallic layer, formed under said light emissive layer, comprising the same metal as said metallic layer.

7. The display panel according to claim 5, wherein said electrically conductive structure comprises an electrically conductive layer under said metallic layer and wherein said first display pixel and said second display pixel comprise a further electrode layer, formed under said light emissive layer, comprising the same electrically conductive material as said electrically conductive layer.

8. The display panel according to claim 1, wherein a hydrophilic layer is formed at said first barrier structure and said second barrier structure contacting said light emissive layer.

9. The display panel according to claim 1, wherein said display panel comprises contact lines to provide a signal for said electrode layer via said electrically conductive structure.

10. The display panel according to claim 1, wherein said display panel comprises at least a low electrical resistance line for said first and/or second display pixel and wherein said low electrical resistance line is defined on or over said electrically conductive structure.

11. A display panel formed on a substrate and comprising a plurality of display pixels with at least one light emissive layer and at least one electrode layer deposited on or over said light emissive layer, wherein at least a first display pixel is determined by a first organic barrier structure and a second display pixel, adjacent to said first display pixel, is determined by a second organic barrier structure, wherein said first barrier structure and said second barrier structure are separated by an electrically conductive structure, wherein said display panel further comprises an insulating layer formed under said electrically conductive structure and a further electrically conductive layer comprising a metal, and wherein said electrically conductive structure and said metal are electrically connected via through-holes in said insulating layer.

12. The display panel according to claim 11, wherein a thin film encapsulation layer is provided over said electrode layer.

13. An electric device comprising a display panel according to claim 1 and a signal controller communicatively connected to said display panel.

14. A method for manufacturing a display panel comprising the steps of:
  applying a first barrier structure on a substrate to determine a first display pixel with a first emissive layer and an electrode layer;

applying a second barrier structure on a substrate to determine a second display pixel, adjacent to said first display pixel, with an emissive layer and an electrode layer;

providing an electrically conductive structure, separating said first barrier structure and said second barrier structure, in electrical contact with said electrode layer;

forming an insulating layer under said electrically conductive structure;

forming a further electrically conductive layer comprising a metal; and electrically connecting said metal to said electrically conductive structure via through-holes in said insulating layer.

15. The method according to claim 14, wherein said electrically conductive structure comprises an electrically conductive layer and said first and second display pixel comprise a further electrode layer, further comprising the step of simultaneously forming said further electrode layer for said first and second display pixel and said electrically conductive layer for said electrically conductive structure.

* * * * *